(12) United States Patent
Kusunoki

(10) Patent No.: US 12,316,243 B2
(45) Date of Patent: May 27, 2025

(54) POWER CONVERTER AND FAILURE ANALYSIS METHOD

(71) Applicant: TOSHIBA MITSUBISHI-ELECTRIC INDUSTRIAL SYSTEMS CORPORATION, Chuo-ku (JP)

(72) Inventor: Hironobu Kusunoki, Chuo-ku (JP)

(73) Assignee: TMEIC CORPORATION, Chuo-ku (JP)

( * ) Notice: Subject to any disclaimer, the term of this patent is extended or adjusted under 35 U.S.C. 154(b) by 304 days.

(21) Appl. No.: 17/997,326

(22) PCT Filed: Apr. 30, 2020

(86) PCT No.: PCT/JP2020/018238
§ 371 (c)(1),
(2) Date: Oct. 27, 2022

(87) PCT Pub. No.: WO2021/220451
PCT Pub. Date: Nov. 4, 2021

(65) Prior Publication Data
US 2023/0170825 A1 Jun. 1, 2023

(51) Int. Cl.
*H02M 7/487* (2007.01)
*G01R 31/27* (2006.01)
(Continued)

(52) U.S. Cl.
CPC ............. *H02M 7/487* (2013.01); *H02M 1/32* (2013.01); *H02M 1/325* (2021.05); *G01R 31/27* (2013.01); *H02M 1/0009* (2021.05); *H02M 7/493* (2013.01)

(58) Field of Classification Search
CPC ...... H02M 1/0009; H02M 1/32; H02M 1/325; H02M 7/487; H02M 7/493; G01R 31/27;
(Continued)

(56) References Cited

U.S. PATENT DOCUMENTS

2010/0060222 A1* 3/2010 Kezobo .................. G01R 31/52
318/490
2015/0340977 A1* 11/2015 Tateda ................. H02P 29/0241
318/400.21

(Continued)

FOREIGN PATENT DOCUMENTS

| JP | 5-227758 A | 9/1993 |
| JP | 8-308244 A | 11/1996 |
| JP | 2004-357437 A | 12/2004 |

OTHER PUBLICATIONS

Indian Office Action issued Sep. 6, 2024 in Indian Patent Application No. 202217065706, 6 pages.

*Primary Examiner* — Fred E Finch, III
(74) *Attorney, Agent, or Firm* — Oblon, McClelland, Maier & Neustadt, L.L.P.

(57) ABSTRACT

According to an embodiment, a power converter (1) includes a main circuit (10), an electrification control unit (25), and an analysis unit (24). The main circuit includes a plurality of switching devices (Q1 to Q4), converts direct-current power into multiphase alternating-current power through switching of the plurality of switching devices, is able to supply the multiphase alternating-current power to an alternating-current load (2) connected to an output side, and output a detection result of a device short circuit current flowing in each of the plurality of switching devices. The electrification control unit electrifies the plurality of switching devices for a predetermined time based on one of a plurality of pre-decided analysis test electrification patterns. The analysis unit analyzes soundness of the main circuit using a load current flowing from the main circuit to the alternating-current load, a phase voltage output by the main circuit, and data at the time of electrification for the predetermined time with regard to the device short circuit current flowing in each of the plurality of switching devices.

5 Claims, 13 Drawing Sheets

(51) Int. Cl.
*H02M 1/00* (2007.01)
*H02M 1/32* (2007.01)
*H02M 7/493* (2007.01)

(58) Field of Classification Search
CPC ........ G01R 31/28; G01R 31/40; G01R 31/42; G01R 31/52
See application file for complete search history.

(56) References Cited

U.S. PATENT DOCUMENTS

| | | | |
|---|---|---|---|
| 2015/0349521 A1* | 12/2015 | Liu | H02M 7/487 |
| | | | 361/93.1 |
| 2016/0250947 A1 | 9/2016 | Niimi et al. | |
| 2019/0393825 A1* | 12/2019 | Maeshima | H02P 29/024 |
| 2020/0186075 A1* | 6/2020 | Koikegami | H02P 29/028 |
| 2021/0270911 A1* | 9/2021 | Kageyama | H02M 1/0009 |
| 2023/0268847 A1* | 8/2023 | Morisaki | H02M 1/32 |
| | | | 363/37 |

* cited by examiner

FIG. 5

| DETECTORS, FUNCTIONS | DETECTED SIGNALS | NOTES |
|---|---|---|
| CURRENT DETECTOR (HCT) | Iu | U PHASE OUTPUT CURRENT FBK |
| | Iw | W PHASE OUTPUT CURRENT FBK |
| OUTPUT VOLTAGE DETECTORS (VDET) | Vu | U PHASE OUTPUT VOLTAGE FBK |
| | Vv | V PHASE OUTPUT VOLTAGE FBK |
| | Vw | W PHASE OUTPUT VOLTAGE FBK |
| Vce DETECTION CIRCUIT (DIRECT-CURRENT SHORT-CIRCUIT DETECTION) (IGD) | OCI_UA1 | SHORT-CIRCUIT IS DETECTED WHEN UA1 IS TURNED ON |
| | OCI_UA4 | SHORT-CIRCUIT IS DETECTED WHEN UA4 IS TURNED ON |
| | OCI_UB1 | SHORT-CIRCUIT IS DETECTED WHEN UB1 IS TURNED ON |
| | OCI_UB4 | SHORT-CIRCUIT IS DETECTED WHEN UB4 IS TURNED ON |
| | OCI_VA1 | SHORT-CIRCUIT IS DETECTED WHEN VA1 IS TURNED ON |
| | OCI_VA4 | SHORT-CIRCUIT IS DETECTED WHEN VA4 IS TURNED ON |
| | OCI_VB1 | SHORT-CIRCUIT IS DETECTED WHEN VB1 IS TURNED ON |
| | OCI_VB4 | SHORT-CIRCUIT IS DETECTED WHEN VB4 IS TURNED ON |
| | OCI_WA1 | SHORT-CIRCUIT IS DETECTED WHEN WA1 IS TURNED ON |
| | OCI_WA4 | SHORT-CIRCUIT IS DETECTED WHEN WA4 IS TURNED ON |
| | OCI_WB1 | SHORT-CIRCUIT IS DETECTED WHEN WB1 IS TURNED ON |
| | OCI_WB4 | SHORT-CIRCUIT IS DETECTED WHEN WB4 IS TURNED ON |

FIG. 6

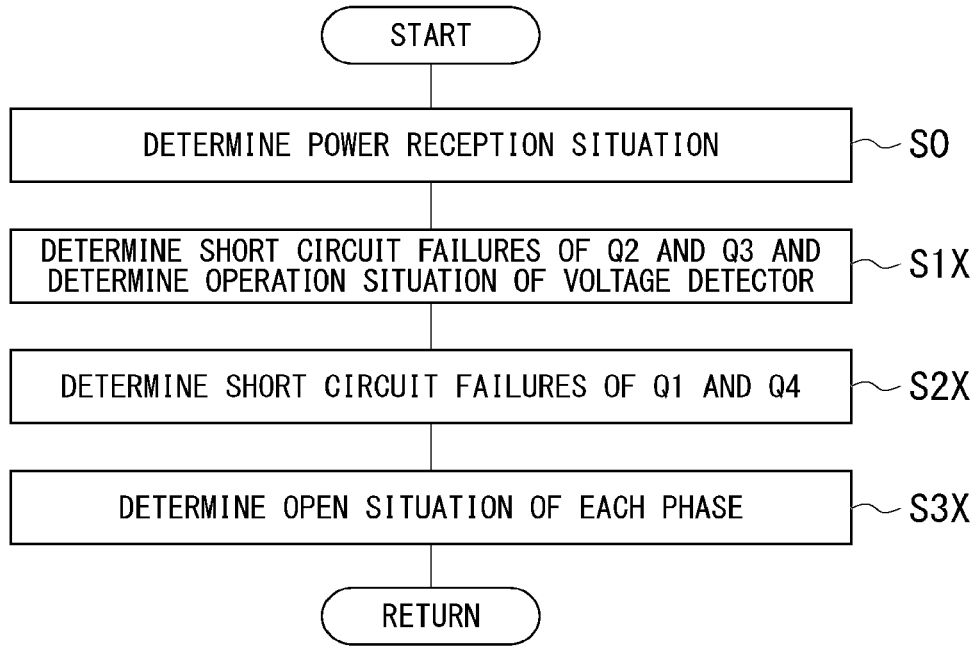

FIG. 7

| EVENT No. | POWER RECEPTION POSSIBILITY | Vdet | OCI DETECTION | EVENTS TO BE CONSIDERED | CONTINUITY POSSIBILITY |
|---|---|---|---|---|---|
| 001 | POSSIBLE | 0 | NO | ・NO DIRECT-CURRENT SHORT-CIRCUITED (POSSIBILITY OF Vdet FAILING) | ◎ |
| 002 | NOT POSSIBLE | — | — | ・REC IS SHORT-CIRCUIT<br>・Q1, 2, AND 3 ARE SHORT-CIRCUITED<br>・Q2, 3, AND 4 ARE SHORT-CIRCUITED<br>・Q1 AND DP ARE SHORT-CIRCUITED<br>・Q4 AND DP ARE SHORT-CIRCUITED | × |
| 003 | POSSIBLE | Vdc | NO | ・Q1 AND Q2 ARE SHORT-CIRCUITED | × |
| 004 | POSSIBLE | −Vdc | NO | ・Q3 AND Q4 ARE SHORT-CIRCUITED | × |

FIG. 11

| EVENT No. | Vdet | OCI DETECTION | EVENTS TO BE CONSIDERED | CONTINUITY POSSIBILITY |
|---|---|---|---|---|
| 131 | Vdc | NO | ALL EXCEPT FOR No. 132 AND No. 133 | ◎ |
| 132 | (UNMEASURABLE) | YES | · Q3 IS SHORT-CIRCUITED | × |
| 133 | 0 | NO | · Q1 IS OPEN<br>· Q2 IS OPEN<br>· Q1 AND Q2 ARE OPEN<br>· ABNORMALITY IN Vdet | ○ |

FIG. 13

| Step11 EVENT No. | Step13 EVENT No. | EVENTS TO BE CONSIDERED | CONTINUITY POSSIBILITY |
|---|---|---|---|
| 111 | 131 | ・Q3 IS NOT SHORT CIRCUITED, VDET IS NORMAL | ◎ |
| | 132 | ・Q3 IS SHORT CIRCUITED | × |
| | 133 | ・Q1 IS OPEN<br>・Q2 IS OPEN<br>・Q1 AND Q2 ARE OPEN<br>・ABNORMALITY IN VDET | ○ |
| 112 | (NOT PERFORMED) | ・Q2 AND Q3 ARE SHORT-CIRCUITED<br>・DP IS SHORT-CIRCUITED | × |
| 113 | 131 | ・Q2 IS SHORT-CIRCUITED | ○ |
| | 132 | NOT POSSIBLE (AS IN 112) | × |
| | 133 | ・Q1 IS OPEN, Q2 IS SHORT-CIRCUITED | ○ |

FIG. 14

| EVENT No. | Vdet | EVENTS TO BE CONSIDERED | CONTINUITY POSSIBILITY |
|---|---|---|---|
| 211 | 0 | ・Q1 NOT SHORT CIRCUITED | ◎ |
| 212 | Vdc | ・Q1 IS SHORT CIRCUITED | × |

FIG. 15

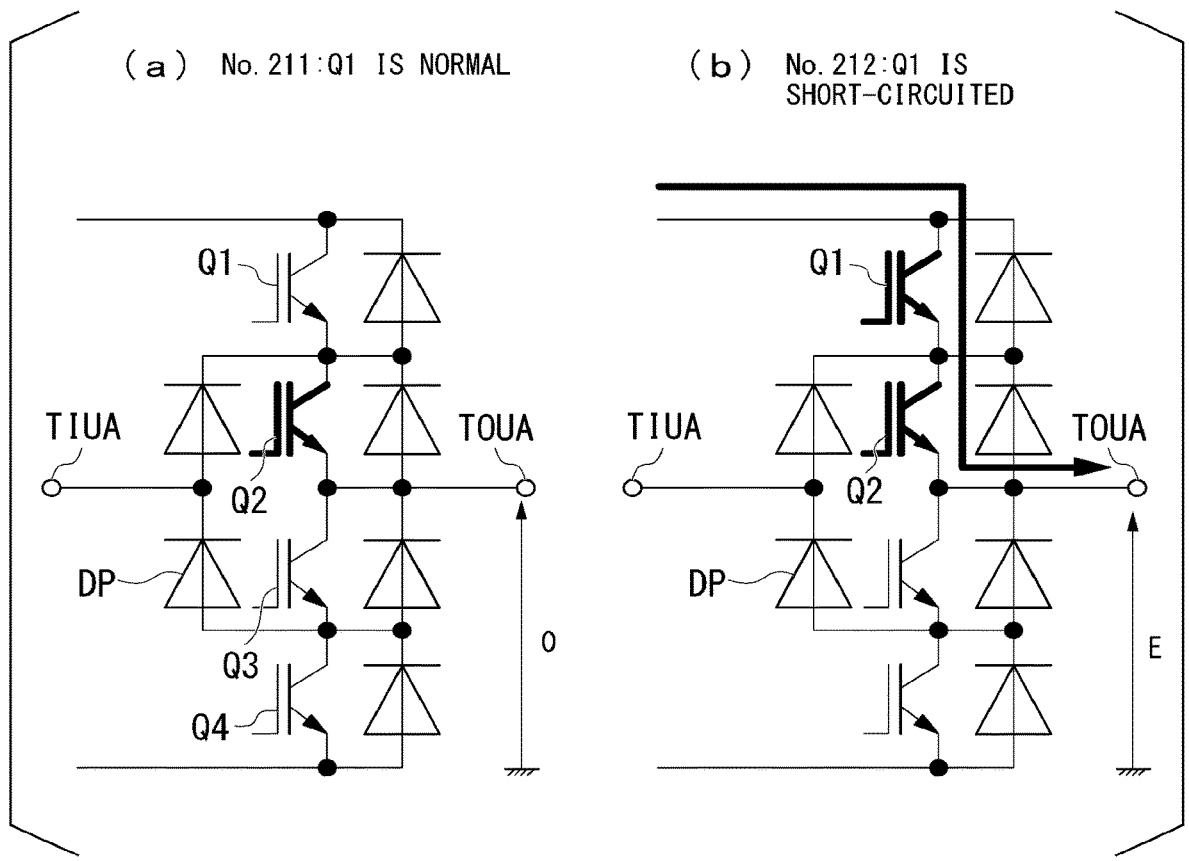

FIG. 16

| Iu, Iw | EVENTS TO BE CONSIDERED | CONTINUITY POSSIBILITY |
|---|---|---|
| BOTH CURRENTS ARE DETECTED | ・ALL DEVICES IN PATH OF CURRENT ARE NOT OPENED<br>・CURRENT DETECTORS ARE BOTH NORMAL | ◎ |
| EITHER CURRENT IS DETECTED | ・ALL DEVICES IN PATH OF CURRENT ARE NOT OPENED<br>・DETECTOR WITH CURRENT = 0 IS ABNORMAL | ○ |
| BOTH CURRENTS = 0 | ・ONE OR MORE DEVICE ARE OPEN<br>・CURRENT DETECTORS ARE BOTH ABNORMAL<br>・OUTPUT IS OPEN | ○ |

POWER CONVERTER AND FAILURE ANALYSIS METHOD

TECHNICAL FIELD

Embodiments relate to a power converter and a failure analysis method.

BACKGROUND ART

A power converter includes a main circuit that includes a plurality of devices (semiconductor switching devices). Soundness of the power converter depends on soundness of each device included in the main circuit. A method of examining the soundness of each device alone is known. However, to examine each device alone, both disassembly and reassembly of the main circuit are necessary. Therefore, the soundness of the main circuit cannot be checked simply in some cases.

CITATION LIST

Patent Literature

[Patent Literature 1]
Japanese Unexamined Patent Application, First Publication No. 2004-357437

SUMMARY OF INVENTION

Technical Problem

To solve the problem, an objective of the present invention is to provide a power converter and a failure analysis method capable of detecting soundness of a main circuit more accurately.

Solution to Problem

According to an embodiment, a power converter includes a main circuit, an electrification control unit, and an analysis unit. The main circuit includes a plurality of switching devices, converts direct-current power into multiphase alternating-current power through switching of the plurality of switching devices, and is able to supply the multiphase alternating-current power to an alternating-current load connected to an output side, and outputs a detection result of a device short circuit current flowing in each of the plurality of switching devices. The electrification control unit electrifies the plurality of switching devices for a predetermined time based on one of a plurality of pre-decided analysis test electrification patterns. The analysis unit analyzes soundness of the main circuit using a load current flowing from the main circuit to the alternating-current load, a phase voltage output by the main circuit, and data at the time of electrification for the predetermined time with regard to the device short circuit current flowing in each of the plurality of switching devices.

BRIEF DESCRIPTION OF DRAWINGS

FIG. 5 is a diagram illustrating a detector according to the embodiment.
FIG. 6 is a flowchart illustrating an analysis process related to the main circuit according to the embodiment.
FIG. 7 is a diagram illustrating a process related to determination of a power reception situation according to the embodiment.
FIG. 11 is a diagram illustrating a process of turning on a switching device Q2 after the switching device Q1 and detecting behaviors of detection results of the voltage Vdet and the short circuit current OCI according to the embodiment.
FIG. 13 is a diagram illustrating a process of performing determination in combination of results of processes of Steps 11 and 13 of FIG. 8.
FIG. 14 is a diagram illustrating a process of determining a short circuit failure in switching devices Q1 and Q4 according to the embodiment.
FIG. 15 is a diagram illustrating each event illustrated in FIG. 14.
FIG. 16 is a diagram illustrating a process of determining an open circuit failure in units of phases according to the embodiment.

DESCRIPTION OF EMBODIMENTS

Hereinafter, a power converter and a failure analysis method according to an embodiment will be described. In the following description, electrical connection is simply referred to as "connection." In the present specification, "based on XX" means "based on at least XX" and also includes a case based on other elements in addition to XX. Further, "based on XX" is not limited to a case in which XX is directly used and also includes a case based on calculation or processing on XX. "XX" is any element (for example, any information).

First Embodiment

Figure 1:
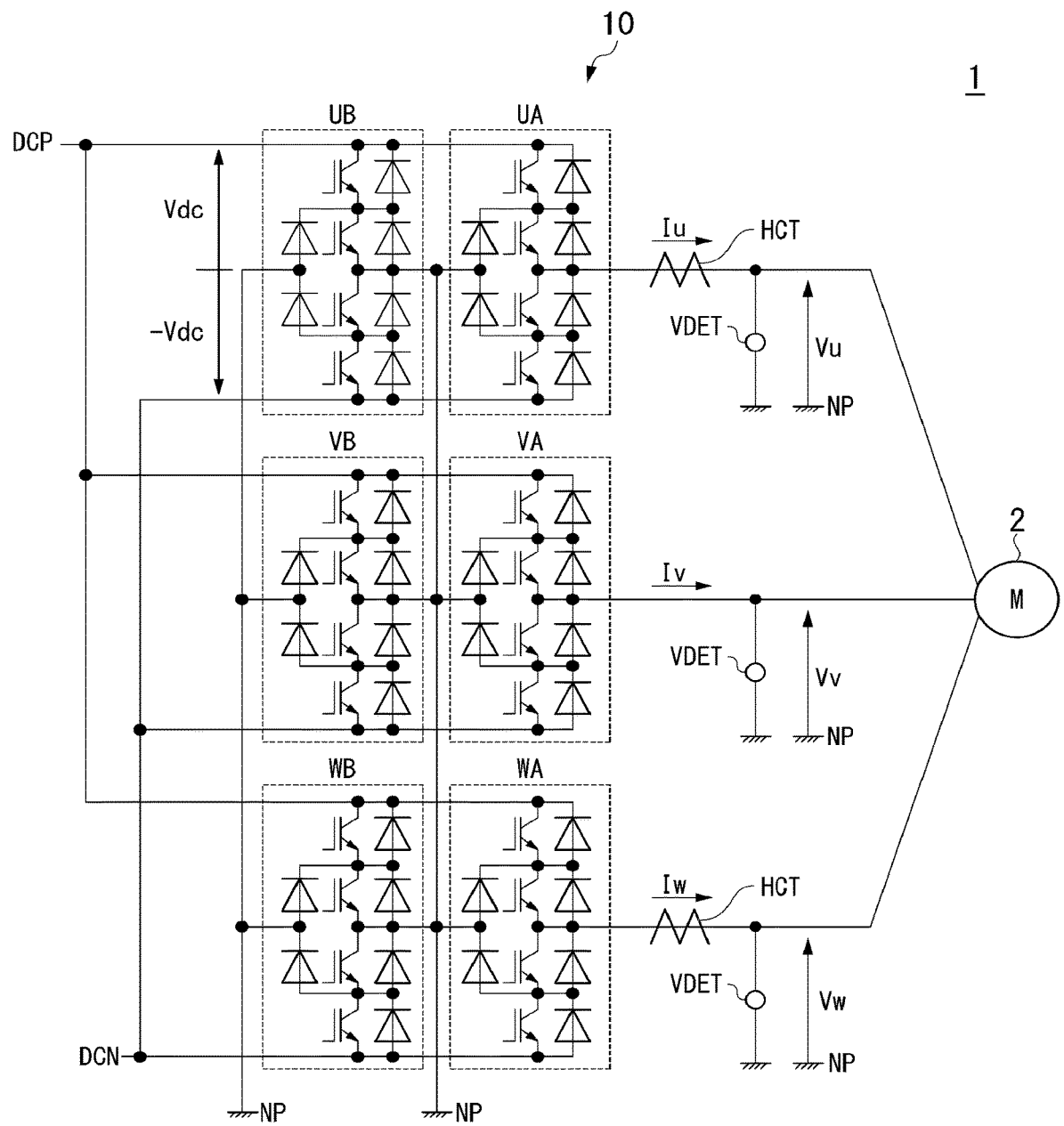
FIG. 1 is a diagram illustrating a configuration of a main circuit of a power converter according to an embodiment.
Figure 2:
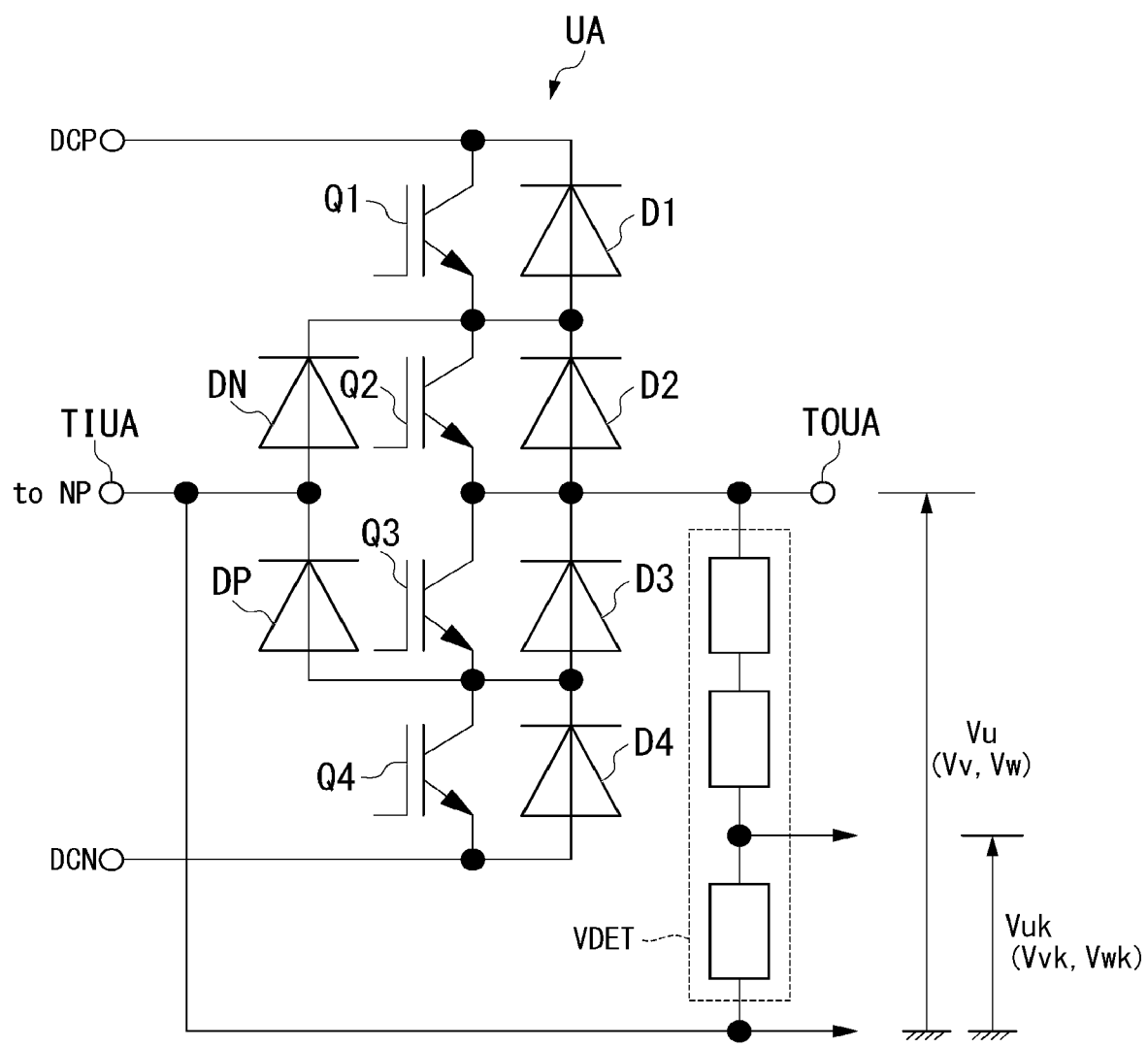
FIG. 2 is a diagram illustrating the main circuit of the power converter according to the embodiment.
Figure 3A:
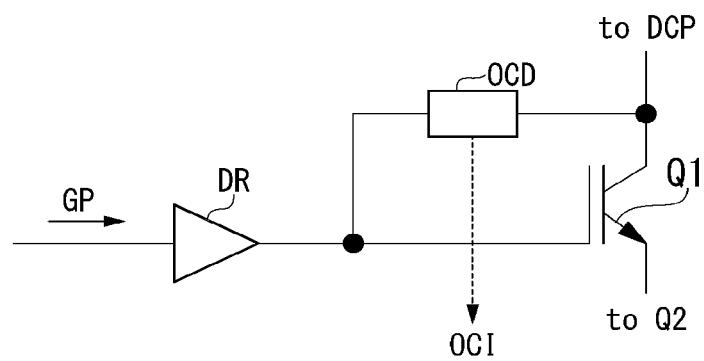
FIG. 3A is a diagram illustrating a configuration of a device short circuit current detection circuit according to the embodiment.
Figure 3B:
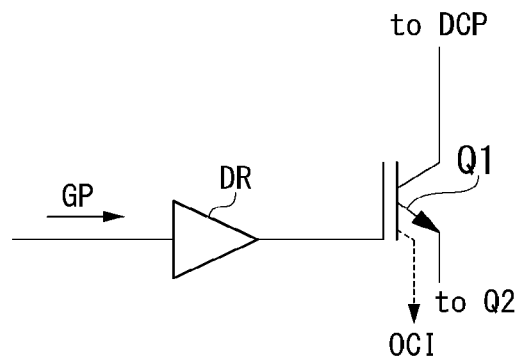
FIG. 3B is a diagram illustrating a configuration of the device short circuit current detection circuit according to the embodiment.
Figure 4:
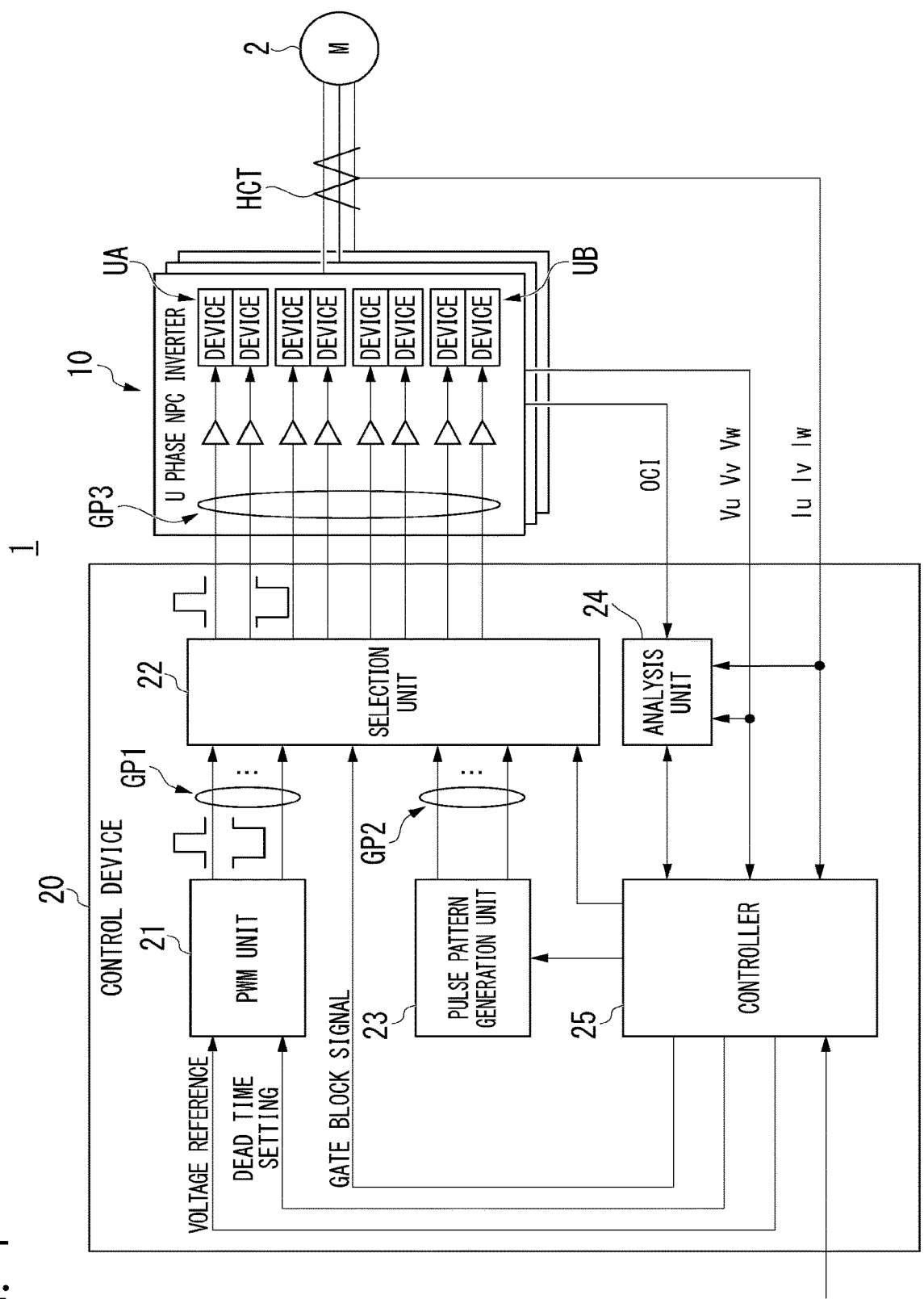
FIG. 4 is a diagram illustrating a configuration of the power converter according to the embodiment.

FIG. 1 is a diagram illustrating a configuration of a main circuit 10 of a power converter 1 according to an embodiment. FIG. 2 is a diagram illustrating the main circuit 10 of the power converter 1 according to the embodiment. FIGS. 3A and 3B are diagrams illustrating a configuration of a device short circuit current detection circuit according to the embodiment. FIG. 4 is a diagram illustrating a configuration of the power converter 1 according to the embodiment.

The power converter 1 illustrated in FIGS. 1 and 4 converts direct-current power into multiphase alternating-current power and supplies the multiphase alternating-current power to an electrical motor 2 to drive the electrical motor 2. For example, the electrical motor 2 is a three-phase alternating-current electrical motor and is an example of an alternating-current load.

The power converter 1 includes, for example, the main circuit 10 and a control device 20.

As illustrated in FIG. 1, the main circuit 10 includes legs UA, VA, WA, UB, VB, and WB. When the legs UA, VA, WA, UB, VB, and WB are not distinguished from each other, the legs UA, VA, WA, UB, VB, and WB are simply referred to as "each leg." A positive electrode power terminal of each leg is supplied with a positive electrode side voltage DCP via a first direct-current bus and a negative electrode power terminal of each leg is supplied with a negative electrode side voltage DCN via a second direct-current bus. Both input and output sides of the legs UB, VB, and WB and input sides of the legs UA, VA, and WA are connected to neutral points NP. The output sides of the legs UA, VA, and WA are connected to windings (not illustrated) of U, V, and W phases of the electrical motor 2 via output terminals (not illustrated) of the phases and alternating-current buses. The output terminal (not illustrated) of the leg UA and the wiring of the U phase of the electrical motor 2 are connected by a first alternating-current bus, the output terminal (not illustrated) of the leg VA and the wiring of the V phase of the electrical motor 2 are connected by a second alternating-current bus, and the output terminal (not illustrated) of the leg WA of the W phase and the wiring of the W phase of the electrical motor 2 are connected by a third alternating-current bus. The first and third alternating-current buses are provided with a current detector HCT. The current detector CT detects a current flowing in the first and third alternating-current buses. As illustrated in FIG. 1, when two current detectors CT are deployed, a phase current Iv may be calculated based on phase currents Iu and Iw detected by two transformers. The deployment and the number of current detectors CT illustrated in FIG. 1 are exemplary and the present invention is not limited thereto. The current detectors CT may be deployed to be able to detect currents of two or three alternating-current buses.

A voltage detector VDET detecting a phase voltage is provided in each of the first to third alternating-current buses. Phase voltages of the U, V, and W phases are referred to as voltages Vu, Vv, and Vw, respectively.

FIG. 2 illustrates an example of each leg included in the main circuit 10. The leg UA illustrated in FIG. 2 includes, for example, the semiconductor switching devices Q1 to Q4, diodes D1 to D4, and diodes DP and DN. Each leg has a configuration similar to the leg UA. Each leg includes the semiconductor switching devices Q1 to Q4 connected in series. The semiconductor switching devices Q1 to Q4 are examples of four semiconductor switching devices. A leg is provided for each phase.

The semiconductor switching devices Q1 to Q4 of the leg UA are, for example, IGBTs. The types of semiconductor switching devices may be changed to MOSFETs or the like without being limited to the IGBTs. The semiconductor switching devices Q1 to Q4 are connected to each other in series. The oppositely connected diode D1 is connected in parallel to an emitter and a collector of the semiconductor switching device Q1. For the semiconductor switching devices Q2 to Q4, the diodes D2 to D4 are connected in parallel similarly. Of the semiconductor switching devices Q1 to Q4, the semiconductor switching devices Q1 and Q2 are included in a positive electrode side arm and the semiconductor switching devices Q3 and Q4 are included in a negative electrode side arm.

The leg UA includes an input terminal TIUA and an output terminal TOUA.

An anode of the diode DP and a cathode of the diode DN are connected to the input terminal TIUA. The cathode of the diode DP is connected to a connection point of the emitter of the semiconductor switching device Q2 and a collector of the semiconductor switching device Q3. An anode of the diode DN is connected to a connection point of the emitter of the semiconductor switching device Q3 and a collector of the semiconductor switching device Q4.

The emitter of the semiconductor switching device Q2, the collector of the semiconductor switching device Q3, the anode of the diode D2, and the cathode of the diode D3 are connected to the output terminal TOUA. Further, a voltage dividing resistor used as the voltage detector VDET is connected to the output terminal TOUA. The voltage detector VDET detects a voltage of the output terminal TOUA, in other words, the voltage Vu applied to the winding of the U phase of the electrical motor 2.

The voltage detector VDET includes a resistive voltage divider of a predetermined ratio. The voltage detector VDET may output a potential Vuk divided at the above ratio instead of outputting the voltage Vu as the voltage of the output terminal TOUA. The same applies to the V and W phases. In the following description, to facilitate description, the voltage Vu in a case in which the above ratio is set to 1 is used.

The leg UA has been described above and the same applies to the legs VA and WA.

Two examples are illustrated in FIGS. 3A and 3B. Detection of a device short circuit current flowing in the switching device will be described.

A circuit illustrated in FIG. 3A includes the switching device Q1, a drive circuit DR driving the switching device Q1, and a device short circuit current detection circuit OCD. For example, the device short circuit current detection circuit OCD is connected between a gate (a control terminal) and the emitter of the switching device Q1 and outputs a signal OCI corresponding to the magnitude of the short circuit current to the switching device Q1 based on a potential difference between the emitter and the gate.

A circuit illustrated in FIG. 3B includes the switching device Q1 and the drive circuit DR driving the switching device Q1. The switching device Q1 outputs the signal OCI corresponding to the magnitude of the short circuit current.

The control device 20 will be described with reference to FIG. 4.

The control device 20 includes a PWM unit 21, a selection unit 22, a pulse pattern generation unit 23, an analysis unit 24, and a controller 25. The pulse pattern generation unit 23 and the controller 25 are examples of an electrification control unit.

The PWM unit 21 modulates a voltage reference based on a carrier signal to generate a gate pulse GP1 for supplying the modulated voltage reference to each leg. The PWM unit 21 adjusts the gate pulse for each semiconductor switching device so that a through-current does not flow in each leg based on a dead time setting.

The selection unit 22 selects one of the gate pulse GP1 generated by the PWM unit 21 and a gate pulse GP2 generated by the pulse pattern generation unit 23 to be described below and outputs a gate pulse GP3 of a selection result. The selection unit 22 limits an output of the gate pulse GP3 arising from the gate pulse GP1 when a gate block signal is 1.

The pulse pattern generation unit 23 generates the gate pulse GP2 for electrifying the switching devices Q1 to Q4 of each leg for the predetermined time based on one of a plurality of pre-decided analysis test electrification patterns.

For example, the analysis test electrification pattern is determined in advance to correspond to an order and an item of an analysis test. In this case, the pulse pattern generation unit 23 generates the gate pulse GP2 corresponding to an item of a selected analysis test. The analysis test electrification patterns are different from the electrification patterns of the switching devices Q1 to Q4 at a normal time at which direct-current power is converted to multiphase alternating-current power. For example, a gate pulse defined in accordance with the analysis test electrification pattern is defined with a pulse width in which an electrification time is determined based on allowable characteristics of each switching device. Data of the plurality of analysis test electrification patterns may be formed as a table and may be retained in a storage region of a storage unit (not illustrated). The pulse pattern generation unit 23 may read the data of the table and generate the gate pulse GP2.

The analysis test electrification patterns are each defined on the premise that there is a case in which one switching device fails among the switching devices Q1 to Q4 of each leg. If one of the switching devices fails, an application order of the analysis test electrification patterns is defined so that the failure does not spread. Specifically, the application order of the analysis test electrification patterns is defined so that the failure of one of the switching devices does not lead to an additional failure of another switching device.

The analysis unit 24 acquires load currents Iu, Iv, and Iw flowing from the main circuit 10 to the electrical motor 2 (the alternating-current load), the phase voltages Vu, Vv, and Vw output by the main circuit 10, and data at the time of electrification for the predetermined time with regard to a device short circuit current flowing in each of the switching devices Q1 to Q4 in the main circuit 10. The analysis unit 24 analyzes soundness of the main circuit 10 using the acquired data. The details of an analysis process will be described.

The controller 25 receives an instruction from a host device and generates various signals related to control of the electrical motor 2. For example, the controller 25 generates the voltage reference, a dead time setting of a gate pulse given to the switching devices Q1 to Q4 in the main circuit 10, and the gate block signal by using feedback signals illustrated in FIG. 5 to be described below. The controller 25 supplies the voltage reference and the dead time setting to the PWM unit. The controller 25 supplies the gate block signal to the selection unit.

Further, the controller 25 controls the selection unit 22, the pulse pattern generation unit 23, and the analysis unit 24 and analyzes a state of the main circuit 10 in units of legs in a pre-decided order with regard to items of desired analysis tests. The controller 25 acquires an analysis result of the soundness of the main circuit 10 from the analysis unit 24.

FIG. 5 is a diagram illustrating a detector according to the embodiment.

Items of a table of FIG. 5 includes items of detectors and functions, detected signals, and notes. The detectors and functions indicate functions and types of detectors. The detected signals indicate signals detected by the detectors.

For example, the current detector HCT detects a phase current Iu of the U phase and a phase current Iv of the V phase. The controller 25 may use detection results by the current detector HCT as feedback signals (a U phase output current FBK and a V phase output current FBK) of current control.

The voltage detector VDET detects the phase voltage Vu of the U phase, the phase voltage Vv of the V phase, and the phase voltage Vw of the W phase. The controller 25 may use detection results by the voltage detectors VDET as feedback signals (a U phase output voltage FBK, a V phase output voltage FBK, and a W phase output voltage FBK) for controlling the main circuit 10.

A device short circuit current detection circuit OCD which is a Vce detection circuit detects a short-circuit when the switching devices Q1 to Q4 of each leg are turned on.

An analysis process related to diagnosis of the main circuit 10 will be described with reference to FIGS. 6 to 16.

(Overview of Analysis Process)

First, an overview of an analysis process will be described.

(1) In a starting stage of the analysis process, all the devices (the semiconductor switching devices) included in the main circuit 10 are assumed to be in question. The fact that "a device is in question" means that there is a possibility of the device not being in a normal functional state. Accordingly, the control device 20 determines whether each target portion is sound by using a detection result of each detector.

(2) In the starting stage of the analysis process, it is assumed that detectors such as the current detector HCT and the voltage detector VDET are also in question. The fact that "a detector is in question" means that there is a possibility of the detector not being in a normal functional state. In particular, when an output of the detector is 0, it cannot be identified whether the output is 0 due to a failure and non-function or an actual detected value is 0. Therefore, it is determined that the detector is in question. Conversely, when a detector is sound, a value to be output from the detector is output, for example, after a detected value is 0. When the control device 20 detects a value to be output from the detector, the detector is not in a failure state in which 0 is output. Therefore, it is determined that the detector is sound.

(3) When a short-circuit is detected in the switching devices Q1 and Q4, the control device 20 interrupts a test related to the analysis process in that stage. For an item in which the analysis process is not performed or a portion in which a test cannot be performed, the control device 20 outputs the fact that the test is incomplete due to the interruption of the test.

For example, when the test is continued, there is concern of a secondary failure occurring. When it is not known that the interruption of the test is not explicit, this is not known and electrification or the test is attempted without knowing this, there is concern of the secondary failure occurring. Damage is prevented from spreading due to the occurrence of the secondary failure.

(4) After it can be checked that none of the devices in the main circuit 10 is short-circuited, the control device 20 attempts to electrify the devices to test whether an open circuit failure does not occur in the devices.

(5) When the configuration of the main circuit 10 is simplified, the detection of the short circuit failure in the switching devices Q2 and Q3 may be omitted. When the detection of the short circuit failure in the switching devices Q2 and Q3 is omitted, the control device 20 does not perform control such that the switching devices Q2 and Q3 enter an ON state alone in a short-circuit test. For example, when the semiconductor switching devices Q1 and Q3 are short-circuited and the switching device Q2 is electrified alone, a short circuit current flows and the secondary failure is likely to occur. In the short-circuit test, the damage is prevented from spreading by principally prohibiting the switching devices Q2 and Q3 from being controlled alone to the ON state. After it is confirmed that the switching devices Q2 and Q3 are not both short-circuited, the failure current does not flow. Therefore, the control device 20 may perform control such that the switching devices Q2 and Q3 enter the ON state alone.

Based on the above basic policy, the control device 20 performs the analysis process on the main circuit.

(Details of Analysis Process)

FIG. 6 is a flowchart illustrating an analysis process related to the main circuit 10 according to the embodiment.

The controller 25 divides the analysis process into the following four stages and performs the analysis process of the main circuit.

Step 0: determining power reception situation;

Step 1X: determining short circuit failure in the switching devices Q2 and Q3 and determining an operation situation of the voltage detector;

Step 2X: determining short circuit failure in the switching devices Q1 and Q4; and Step 3X: determining an open circuit failure in units of phases.

Hereinafter, the details of the process in each stage will be described in order.

(Step 0: Determining Power Reception Situation)

A process related to determination of a power reception situation will be described with reference to FIG. 7. FIG. 7 is a diagram illustrating a process related to determination of a power reception situation according to the embodiment. The table illustrated in FIG. 7 shows examples of a determination standard of the power reception situation. The table includes items of event No., power reception possibility, Vdet, OCI detection, events to be considered, and continuity possibility. The item of event No. includes identification information with which events detected by the controller 25 can be identified. The item of the power reception possibility indicates that a result obtained by receiving direct-current power is power reception possibility ("possible") or not ("not possible"). The item of Vdet indicates the magnitude of a phase voltage detected by the voltage detector. In the item of the OCI detection, all the switching devices Q1 to Q4 in the main circuit 10 are targets. When a short circuit current is not detected in the switching devices Q1 to Q4, "NO" is indicated. The item of the events to be considered enumerates events to be considered based on results of the items of the power reception possibility, Vdet, and the OCI detection. Of the columns, transcription of "Dx," "Qx," and the like (where x is a number) indicates abbreviations for a diode Dx and a switching device Qx. In the item of the continuity possibility, as examples of determination, a mark "⊙" indicates a state in which continuity is possible without problem and a mark "x" indicates a state in which the continuity is not possible.

The controller 25 first performs a process of determining a power reception situation of the direct-current power.

A case in which the direct-current power cannot be received includes a time at which all the switching devices Q1, Q2, and Q3 are short-circuited, a time at which all the switching devices Q2, Q3, and Q4 are short-circuited, a time at which both the switching device Q1 and the diode DP are short-circuited, or a time at which both the switching device Q4 and the diode DN are short-circuited. Further, the case in which the direct-current power cannot be received includes a time at which a direct-current voltage to be output does not increase even though an abnormality occurs in a rectifier circuit (REC) of a direct-current power device (not illustrated) and electrification is detected on the input side of the direct-current power device.

Conversely, when the direct-current power can be received, the following test items are determined.

For example, when the controller 25 does not output the gate pulse GP3 and the voltage detector VDET detects a voltage equal to or greater than a predetermined value, it is determined that there is a possibility of short-circuit of two devices among the switching devices Q1 to Q4 and the diodes DN and DP, and various tests involved in the electrification and the analysis process in the main circuit 10 end.

As illustrated in the row of event number "001" (simply referred to as Event 001 and the same applies below), the power reception is possible. When the voltage Vdet is 0 volts (V) and an overcurrent detection value OCI is not detected, the controller 25 determines that a short circuit failure (direct-current short-circuit) does not occur in a device that outputs the direct-current voltage. In this case, the controller 25 can continue to electrify the main circuit 10. Here, according to a detection result of this stage, the voltage Vdet is 0 volts (V). Therefore, as described above, there is a possibility of the voltage detector VDET failing.

As illustrated in the row of Event 002, when the power reception is not possible, the controller 25 estimates that a short circuit failure occurs in the following portions. In this case, the controller 25 continues to limit the electrification of the main circuit 10. A failure estimated from the foregoing event is one of whether the rectifier circuit "REC" of a direct-current power device (not illustrated) is in the short-circuited state, whether the switching devices Q1 to Q3 are in the short-circuited state, whether the switching devices Q2 to Q4 are in the short-circuited state, whether the switching device Q1 and the diode DP are in the short-circuited state, and whether the switching device Q4 and the diode DN are in the short-circuited state.

As illustrated in the row of Event 003, when the power reception is possible, Vdc is detected as the voltage Vdet, and the overcurrent detection value OCI is not detected, the controller 25 estimates that the switching devices Q1 and Q2 are in the short-circuited state. In this case, the controller 25 continues to limit the electrification of the main circuit 10.

As illustrated in the row of Event 004, when the power reception is possible, −Vdc is detected as the voltage Vdet, and the overcurrent detection value OCI is not detected, the controller 25 estimates that the switching devices Q3 and Q4 are in the short-circuited state. In this case, the controller 25 continues to limit the electrification of the main circuit 10.

(Step 1X: Determining Short Circuit Failure in Switching Devices Q2 and Q3 and Determining Operation Situation of Voltage Detector)

Processes related to determination of a short circuit failure in the switching devices Q2 and Q3 and determination of an operation situation of the voltage detector will be described with reference to FIGS. 8 to 13.

Figures 8, 9:
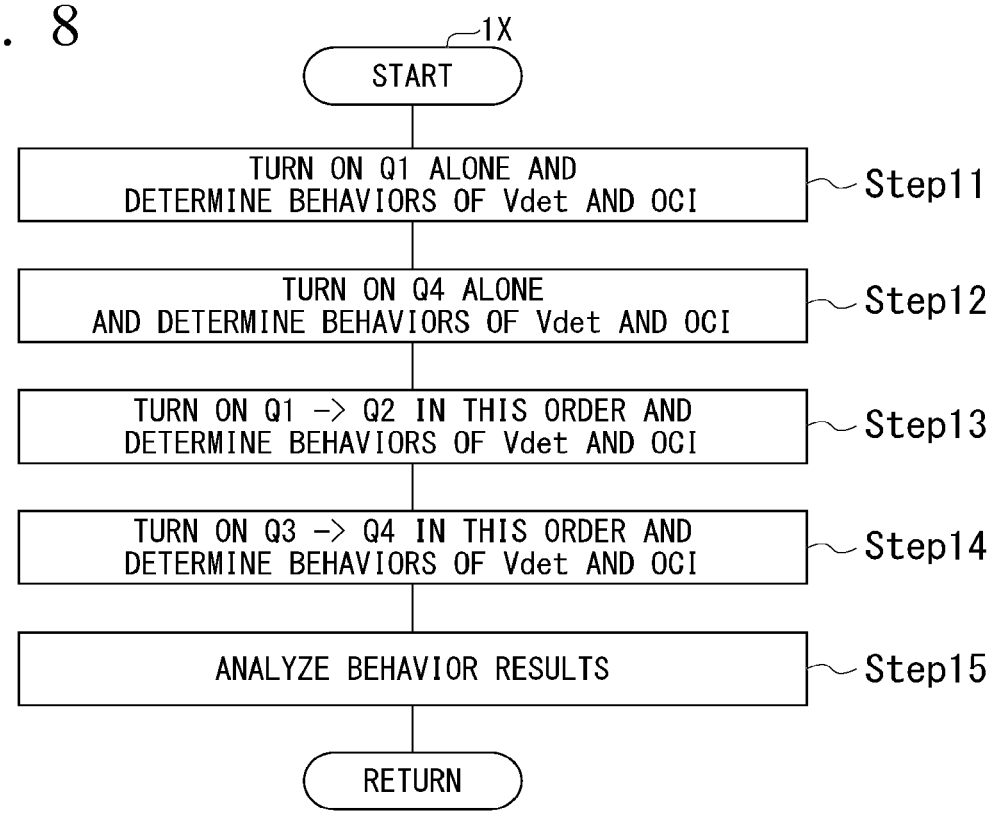
FIG. 8 is a flowchart illustrating processes related to determination of a short circuit failure in switching devices and determination of an operation situation of a voltage detector according to the embodiment.
FIG. 9 is a diagram illustrating a process of turning on a switching device Q1 alone and detecting behaviors of detection results of a voltage Vdet and a short circuit current OCI according to the embodiment.

FIG. 8 is a flowchart illustrating processes related to determination of a short circuit failure in the switching devices Q2 and Q3 and determination of an operation situation of the voltage detector according to the embodiment.

The controller 25 divides the process into the following five stages and performs the process related to the determination of a short circuit failure in the switching devices Q2 and Q3 and determination of an operation situation of the voltage detector. The controller 25 controls the pulse pattern generation unit 23 and the analysis unit 24 in each stage of the following Step 11 to Step 14 and acquires an analysis result of the state of the main circuit 10 from the analysis unit 24.

Step 11: turning on the switching device Q1 alone and detecting behaviors of detection results of the voltage Vdet and the short circuit current OCI.

For example, the pulse pattern generation unit 23 outputs the gate pulse GP2 for turning on the switching device Q1 alone. The analysis unit 24 analyzes a state of the main circuit 10 under the foregoing condition.

Step 12: turning on the switching device Q4 alone and detecting behaviors of detection results of the voltage Vdet and the short circuit current OCI.

For example, the pulse pattern generation unit 23 outputs the gate pulse GP2 for turning on the switching device Q4 alone. The analysis unit 24 analyzes a state of the main circuit 10 under the foregoing condition.

Step 13: turning on the switching device Q2 after the switching device Q1 and detecting behaviors of detection results of the voltage Vdet and the short circuit current OCI.

For example, the pulse pattern generation unit 23 outputs the gate pulse GP2 for turning on the switching device Q2 in addition to the switching device Q1. The analysis unit 24 analyzes the state of the main circuit 10 under the foregoing condition.

Step 14: turning on the switching device Q3 after the switching device Q4 and detecting behaviors of detection results of the voltage Vdet and the short circuit current OCI.

For example, the pulse pattern generation unit 23 outputs the gate pulse GP2 for turning on the switching device Q3 in addition to the switching device Q4. The analysis unit 24 analyzes the state of the main circuit 10 under the foregoing condition.

Step 15: analyzing the behavior results.

The analysis unit 24 analyzes the state of the main circuit 10 by using the analysis results in Step 11 to Step 14.

According to the order of the foregoing analysis process, analysis (step 11 and Step 12) in which a first analysis test electrification pattern for turning on the switching device Q1 or Q4 is used among a plurality of pre-decided analysis test electrification patterns is performed earlier than analysis (Step 13 and Step 14) in which a second analysis test electrification pattern for turning on the switching devices Q1 and Q2 or the switching devices Q3 and Q4 is used. Thus, a failure is prevented from spreading.

The details of the analysis process in each of the foregoing stages will be described in order.

(Step 11: Turning on the Switching Device Q1 Alone and Detecting Behaviors of Detection Results of the Voltage Vdet and the Short Circuit Current OCI)

Figure 10:
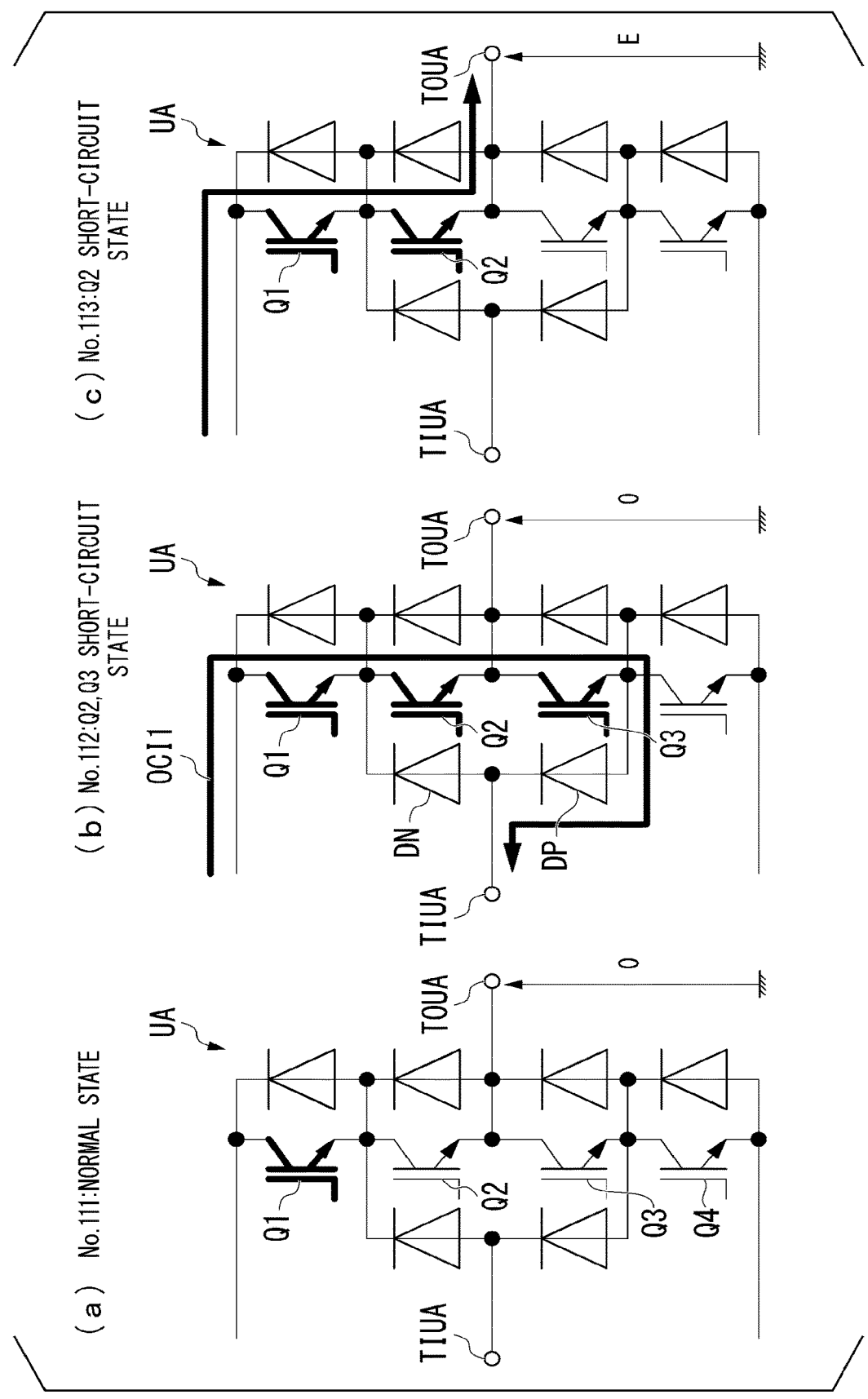
FIG. 10 is a diagram illustrating each event illustrated in FIG. 9.

FIG. 9 is a diagram illustrating a process of turning on the switching device Q1 alone and detecting behaviors of detection results of the voltage Vdet and the short circuit current OCI according to the embodiment. The table illustrated in FIG. 9 shows examples of a determination standard when the switching device Q1 is turned on alone. The table includes items of event No., Vdet, OCI detection, events to be considered, and continuity possibility. In the item of the continuity possibility, as examples of determination, a mark "⊚" indicates a state in which continuity is possible without problem, a mark "O" indicates a state in which the continuity is possible with a slight problem in part, and a mark "x" indicates a state in which the continuity is not possible. FIG. 10 is a diagram illustrating each event illustrated in FIG. 9.

Subsequently, the controller 25 performs determination of a short circuit failure in the switching devices Q2 and Q3 and determination of an operation situation of the voltage detector. In the test of this stage, the controller 25 turns on the switching device Q1 alone and determines that the switching devices Q2 and Q3 and the diode DP are not short-circuited.

As illustrated in Event 111, when the voltage Vdet is 0 volts (V) and the overcurrent detection value OCI is not detected, all the events except for Events 112 and 113 to be described below are included in assumed events. In this case, the controller 25 can continue to electrify the main circuit 10. That is, as illustrated in (a) of FIG. 10, in a situation in which the switching devices Q2 and Q3 and the diode DP are not short-circuited, a short circuit current does not flow even though the switching device Q1 is turned on alone.

As illustrated in Event 112, when the overcurrent detection value OCI is detected regardless of the detection result of the voltage Vdet, the analysis unit 24 determines whether both the "switching devices Q2 and Q3" are in the short-circuited state or the diode DP is in the short-circuited state. In this case, the controller 25 does not continue to use the main circuit 10. That is, in the foregoing situation, as illustrated in (b) of FIG. 10, a short circuit current flows to the input terminal TIUA side by just turning on the switching device Q1 alone.

As illustrated in Event 113, when Vdc is detected as the voltage Vdet and the overcurrent detection value OCI is not detected, the analysis unit 24 determines that the "switching device Q2" is in the short-circuited state. In this case, the controller 25 continues to use the main circuit 10. That is, in the foregoing situation, as illustrated in (c) of FIG. 10, a short circuit current flows to the output terminal TOUA side by just turning on the switching device Q1 alone.

(Step 12: Turning on the Switching Device Q4 Alone and Detecting Behaviors of Detection Results of the Voltage Vdet and the Short Circuit Current OCI)

Further, the controller 25 turns on the switching device Q4 alone instead of the switching device Q1 and performs a similar test.

The controller 25 performs the analysis process of Step 11 and Step 12 on all the legs in each phase for each of the U, V, and W phases in order.

(Step 13: Turning on the Switching Device Q2 after the Switching Device Q1 and Detecting Behaviors of Detection Results of the Voltage Vdet and the Short Circuit Current OCI)

Figure 12:
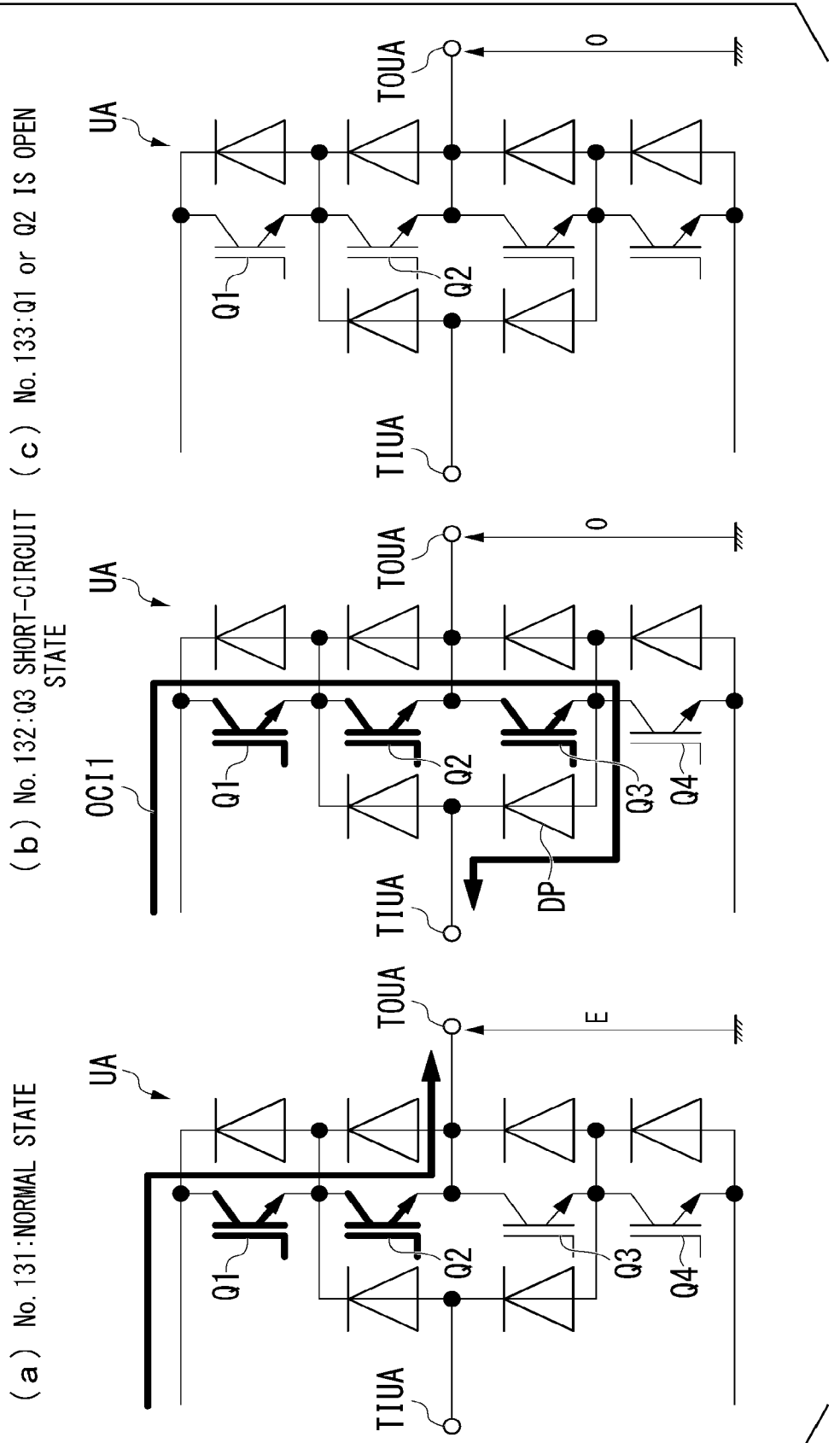
FIG. 12 is a diagram illustrating each event illustrated in FIG. 11.

FIG. 11 is a diagram illustrating a process of turning on the switching device Q2 after the switching device Q1 and detecting behaviors of detection results of the voltage Vdet and the short circuit current OCI according to the embodiment. A table illustrated in FIG. 11 shows examples of a determination standard when the switching device Q2 is turned on after the switching device Q1. FIG. 12 is a diagram illustrating each event illustrated in FIG. 11. When the switching device Q2 is turned on after the switching device Q1, it is assumed that the switching device Q2 is turned on while maintaining the ON state of the switching device Q1.

The analysis unit 24 turns on the switching device Q2 after the switching device Q1 and detects the behaviors of the detection results of the voltage Vdet and the short circuit current OCI. Thus, the detection results of the voltage Vdet and the short circuit current OCI are changed as follows.

As illustrated in Event 131, when Vdc is detected as the voltage Vdet and the overcurrent detection value OCI is not detected, the analysis unit 24 determines that all the events except for Events 132 and 133 to be described below are included in assumed events. In this case, the controller 25 can continue to electrify the main circuit 10. That is, as illustrated in (a) of FIG. 12, when the switching devices Q1 and Q2 are turned on in a situation in which the switching devices Q2 and Q3 and the diode DP are not short-circuited, a short circuit current does not flow and the voltage Vdc is output to the output terminal TOUA.

As illustrated in Event 132, when the voltage Vdet is not detected and the overcurrent detection value OCI is detected, the analysis unit 24 determines that the "switching device Q3" is in the short-circuited state. In the foregoing situation, as illustrated in (b) of FIG. 12, a short circuit current flows to the input terminal TIUA side by just turning on the switching devices Q1 and Q2. In this case, the controller 25 does not continue to use the main circuit 10.

As illustrated in Event 133, when the voltage Vdet is 0 volts (V) and the overcurrent detection value OCI is not detected, the analysis unit 24 determines whether the "switching device Q1" is in an open state, whether the "switching device Q2" are in the open state, whether both the "switching devices Q1 and Q2" are in the open state, or whether an abnormality occurs in a voltage detector VDET. In the foregoing situation, as illustrated in (c) of FIG. 12, the voltage of the output terminal TOUA becomes 0 V even though the switching devices Q1 and Q2 are turned on, and thus a short circuit current does not occur. In this case, the controller 25 continues to use the main circuit 10.

Further, the controller 25 performs a similar test by turning on the switching devices Q4 and Q3 in the analysis process of Step 14 instead of the switching devices Q1 and Q2 in the analysis process of Step 13.

The controller 25 performs the analysis process of Step 13 and Step 14 on all the legs in each phase for each of the U, V, and W phases in order.

When the results of the processes of Step 11 and Step 13 are arranged in combination, determination illustrated in FIG. 13 can be performed. Although detailed description will be omitted, similar results can be obtained by combining the results of the processes of Step 12 and Step 14.

FIG. 13 is a diagram illustrating a process of performing determination in combination of results of processes of Steps 11 and 13 of FIG. 8. A table illustrated in FIG. 13 shows examples of a determination standard when the results of the processes of Step 11 and Step 13 are determined in combination. The table includes items of Step 11 event No., Step 13 event No., events to be considered, and continuity possibility.

When Event 131 of Step 13 is detected in Event 111 of Step 11, the analysis unit 24 determines that the switching device Q3 is not short-circuited and the voltage detector VDET normally functions. In this case, there is no problem in the main circuit 10 and the controller 25 can continue electrification.

Similarly, when Event 132 of Step 13 is detected, the analysis unit 24 determines that use of the main circuit 10 cannot be continued because the switching device Q3 is short-circuited.

Similarly, when Event 133 of Step 13 is detected, the analysis unit 24 determines whether the "switching device Q1" is in the open state, whether the "switching device Q2" is in the open state, whether both the "switching devices Q1 and Q2" are in the open state, or whether an abnormality occurs in the voltage detector VDET. In this case, the controller 25 continues to use the main circuit 10.

When Event 112 of Step 11 is detected, the analysis unit 24 does not perform the analysis process of Step 13. The result is similar to that of Event 112 of Step 11.

When Event 131 of Step 13 is detected in Event 113 of Step 11, the analysis unit 24 determines that the switching device Q2 is short-circuited. In this case, the controller 25 continues to use the main circuit 10. In Event 113 of Step 11, Event 132 of Step 13 is not detected and the same result as that of Event 112 of Step 11 is obtained. When Event 133 of Step 13 is detected in Event 113 of Step 11, the analysis unit 24 determines that the "switching device Q1" is in the open state and the "switching device Q2" is in the short-circuited state. In this case, the controller 25 continues to use the main circuit 10.

In other words, when a digit in the ones place of an event number is "1" as in No. XX1 in each of Step 11 and Step 13, the analysis unit 24 determines that both the switching devices Q2 and Q3 are not short-circuited and determines that the voltage detector VDET normally functions.

(Step 2X: Determining Short Circuit Failure in Switching Devices Q1 and Q4)

Next, a process of determining a short circuit failure in the switching devices Q1 and Q4 will be described with reference to FIGS. 14 and 15.

FIG. 14 is a diagram illustrating a process of determining a short circuit failure in the switching devices Q1 and Q4 according to the embodiment. The table illustrated in FIG. 14 shows examples of a determination reference of the short circuit failure in the switching devices Q1 and Q4. The table includes items of event No., Vdet, events to be considered, and continuity possibility. FIG. 15 is a diagram illustrating each event illustrated in FIG. 14.

Next, the controller 25 determines a short circuit failure in the switching device Q1. In a test of this stage, the controller 25 turns on the switching device Q2 alone and determines whether the switching device Q1 is not short-circuited. Conditions that an execution of the test of this step is permitted are conditions that the switching devices Q2 and Q3 are not short-circuited and the voltage detector VDET normally functions (the voltage Vdet which is a detection result of the voltage detector VDET is a value within a desired range).

The analysis unit 24 determines a behavior of the voltage Vdet when the switching device Q2 is turned on alone.

For example, as illustrated in Event 211, when the voltage Vdet is 0 volts (V) (see (a) of FIG. 15), the analysis unit 24 determines that the switching device Q1 is in "non-short circuit" in which the device is not in a short-circuited state, determines that there is no problem in the main circuit 10, and continues to electrify the main circuit 10. That is, as illustrated in (a) of FIG. 15, when the switching device Q1 is in a normally functioning situation, a short circuit current does not flow even though the switching device Q2 is turned on. Then, 0 V is output to the output terminal TOUA.

As illustrated in Event 212, when Vdc is detected as the voltage Vdet (see (b) of FIG. 15), the analysis unit 24 determines that the "switching device Q1" is in a short-circuited state. In this case, the analysis unit 24 determines that the use of the main circuit 10 cannot be continued.

According to the result of the foregoing process, it may be determined in the detected events that the switching devices Q1 and Q4 of the leg are short-circuited in all the events in which 1 is given to a digit in the ones place of an event number. The controller 25 performs the process of each of the foregoing steps on each leg of UA, UB, VA, VB, WA, and WB in order.

According to the processes from Step 1X to step 2X described above, it is possible to identify that all the devices are not short-circuited. Accordingly, in a subsequent step, the winding of the electrical motor 2 connected to the output terminal of each phase is electrified and it is verified that an open circuit failure does not occur in the main circuit 10.

(Step 3X: Determining Open Circuit Failure in Units of Phases)

Figure 17:
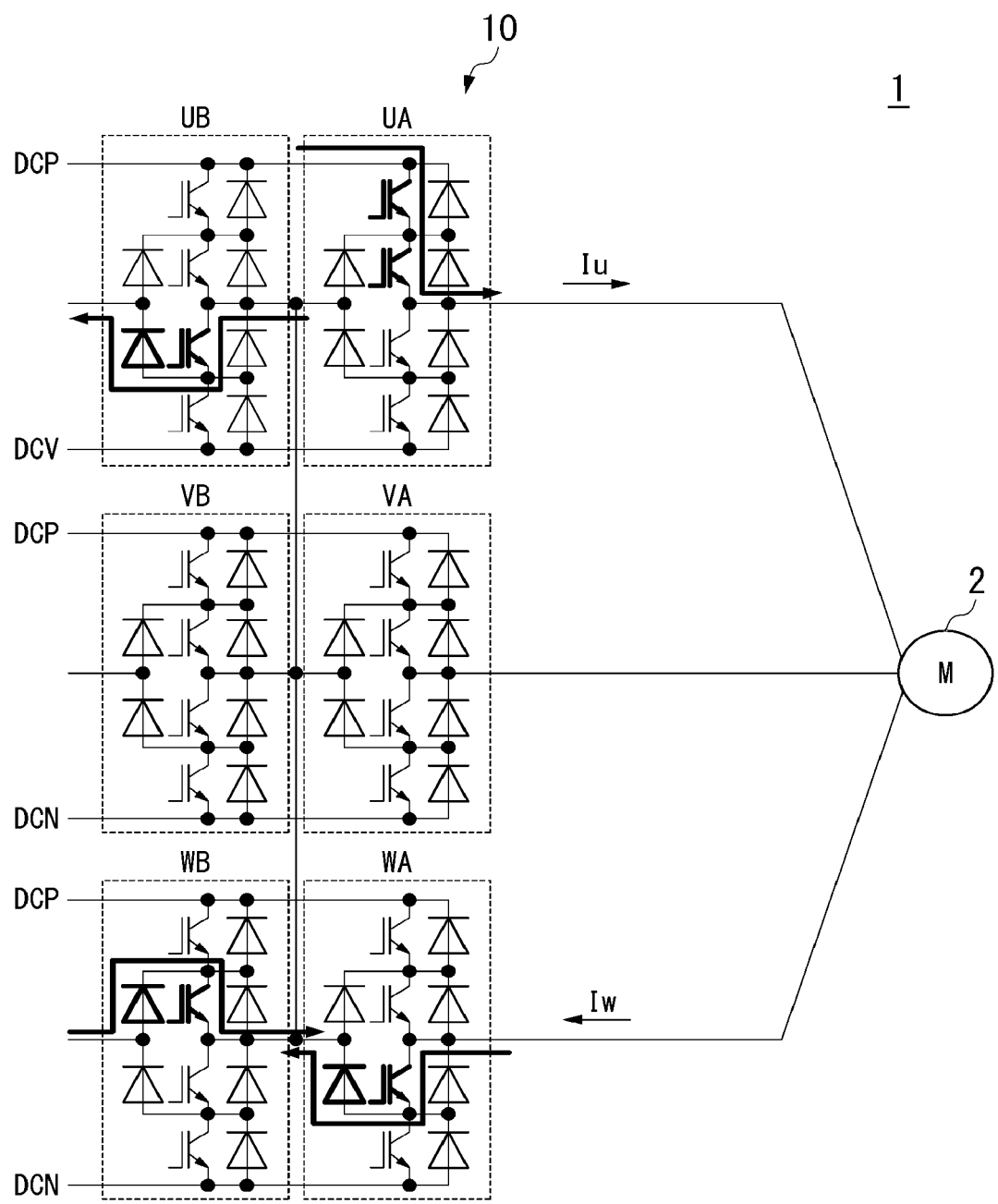
FIG. 17 is a diagram illustrating the events illustrated in FIG. 16.

A process of determining an open circuit failure in units of phases will be described with reference to FIGS. 16 and 17.

FIG. 16 is a diagram illustrating a process of determining an open circuit failure in units of phases according to the embodiment. The table illustrated in FIG. 16 shows examples of a determination reference of the open circuit failure in units of phases. The table includes items of Iu, Iw, events to be considered, and continuity possibility. FIG. 17 is a diagram illustrating the events illustrated in FIG. 16.

When the main circuit 10 and the electrical motor 2 are both in a sound state and the controller 25 flows a current from the output terminal TOUA of the U phase of the main circuit 10 to the winding of the U phase of the electrical motor 2, the current flows to the winding of the W phase of the electrical motor 2 and returns to the output terminal TOUA of the W phase of the main circuit 10. In the process of determining the open circuit failure in units of phases, the controller 25 detects a state of the main circuit 10 by controlling each switching device such that electrification is achieved between the U phase and the W phase and detecting behaviors of the phase currents Iu and Iw.

When both the phase currents Iu and Iw are detected, the analysis unit 24 performs determination as follows. For example, devices (switching devices) in a route (path) of a current do not include devices in which an open circuit failure occurs. In other words, all the devices in the route of the current are not opened. It can be determined that two current detectors HCT normally function. In this case, the controller 25 can continue to electrify the main circuit 10.

When either the phase current Iu or Iw is detected, the analysis unit 24 performs determination as follows. For example, devices (switching devices) in a route (path) of a current do not include devices in which an open circuit failure occurs. In other words, all the devices in the route of the current are not opened. Here, it can be determined that, of the two current detectors HCT, the current detector HCT outputting 0 as a current value fails and the other current detector HCT functions. In this case, the controller 25 may continue to electrify the main circuit 10.

When detected values of the phase currents Iu and Iw are both 0, the analysis unit 24 determines that any of the following events occurs. For example, one or more devices in which the open circuit failure occurs are included in the devices (the switching devices) in the route (path) of the current. In other words, one or more devices in the route of the current are opened. The two current detectors HCT both fail, and thus an output value is 0. Examples of an event in which an output is open include an event in which the main circuit 10 and the electrical motor 2 are not connected to each other and an event in which a line from the current detector HCT to the control device 20 is not connected. In this case, the controller 25 may continue to electrify the main circuit 10.

According to the foregoing process, by performing the analysis process, it is possible to detect that abnormality occurs in each device in the main circuit 10 and abnormality occurs in a detector related to the main circuit 10. Thus, it is possible to detect the soundness of the main circuit 10 more accurately.

By using presence or absence of a short circuit current of each device for the analysis process, it is possible to identify whether the main circuit 10 can be continuously operated. For example, when it is detected that a short circuit failure occurs in the switching device Q2 alone in each leg of a 3-level type, as illustrated in FIG. 9, it may be determined that the use of the main circuit 10 can be continued. Thus, in the analysis process according to the embodiment, it can be identified in a simply way that the use of the main circuit 10 can be continued without being interrupted immediately depending on a situation of the failure even though there is a failure. Accordingly, it is possible to adjust a stop time of the power converter 1 in accordance with the extent of failure. Even when it is determined that the use of the main circuit 10 can be continued, prompt maintenance may be planned.

According to the foregoing process, when any failure is detected in the main circuit 10, the controller 25 may output a result of the determination to the outside. At this time, information to be output may include information for identifying a leg in which a failure is detected and an event number of an event detected in a process of each stage. An output destination may be a host control device (not illustrated) or may be a terminal device (not illustrated) used for maintenance inspection work of the main circuit 10.

At least a part of the control device 20 according to the embodiment may be realized by a software functional unit that functions by allowing a processor such as a CPU to execute a program or all of the control device 20 may be realized by a hardware functional unit such as an LSI.

According to at least one of the above-described embodiments, the power converter 1 includes the main circuit 10, the controller 25 (an electrification control unit), and the analysis unit 24. The main circuit 10 includes the switching devices Q1 to Q4, converts direct-current power into multiphase alternating-current power through switching of the switching devices Q1 to Q4, is able to supply the multiphase alternating-current power to the electrical motor 2 (an alternating-current load) connected to an output side, and outputs a detection result of a device short circuit current flowing in each of the switching devices Q1 to Q4. The controller 25 electrifies the switching devices Q1 to Q4 for a predetermined time based on one of a plurality of pre-decided analysis test electrification patterns. The analysis unit 24 analyzes soundness of the main circuit 10 using a load current flowing from the main circuit 10 to the electrical motor 2, a phase voltage (the voltage Vdet) output by the main circuit 10, and data at the time of electrification for the predetermined time with regard to the device short circuit current flowing in each of the switching devices Q1 to Q4. Thus, it is possible to detect the soundness of the main circuit 10 more accurately.

Several embodiments of the present invention have been described, but the embodiments have been suggested as examples and are not intended to limit the scope of the present invention. The embodiments can be implemented in other various forms and various omissions, substitutions, and changes can be made within the scope of the present invention without departing from the gist of the present invention. The embodiments and the modifications are included in the scope or the gist of the present invention and the embodiments and the modifications are similarly included in the equivalent scope to the inventions described in the claims.

For example, the configuration of the main circuit 10 may be of a 2-level type without being limited to the 3-level type. The analysis unit 24 may add a voltage value of the direct-current power which is within a desired range to a detection item.

The controller 25 may perform the foregoing analysis process in a state in which the power converter 1 is stopped. As a result, even when a problem is detected in a part of the main circuit 10 and it is determined that the main circuit 10 can be continuously used, prompt maintenance may be planned so that the power converter 1 is not stopped due to occurrence of a subsequent failure.

When potentials at a neutral point of a direct-current side and a neutral point of an alternating-current side of the main circuit 10 are divided, the output side of the legs UB, VB, and WB may be connected to the neural point of the alternating-current side.

REFERENCES SIGNS LIST

1 Power converter
2 Electrical motor
10 Main circuit
20 Control device
21 PWM unit
22 Selection unit
23 Pulse pattern generation unit
24 Analysis unit
25 Controller
Q1, Q2, Q3, Q4 Switching device

The invention claimed is:

1. A power converter comprising:
   four semiconductor switching devices connected in series in one of legs of a main circuit and configured to convert direct-current power into multiphase alternating-current power through switching of the four switching devices, be able to supply the multiphase alternating-current power to an alternating-current load connected to an output side, and output a detection result of a device short circuit current flowing in each of the four switching devices;
   an electrification control unit configured to electrify the four switching devices for a predetermined time based on one of a plurality of pre-decided analysis test electrification patterns; and
   an analysis unit configured to analyze soundness of the main circuit using a load current flowing from the main circuit to the alternating-current load, a phase voltage output by the main circuit, and data at the time of electrification for the predetermined time with regard to the device short circuit current flowing in each of the four switching devices,
   wherein the electrification control unit performs analysis using, of the plurality of analysis test electrification patterns, a first analysis test electrification pattern in which a first switching device is turned on among the four switching devices earlier than analysis using a second analysis test electrification pattern in which the first switching device and a second switching device are turned on among the four switching devices, and
   wherein the plurality of analysis test electrification patterns and an application order thereof are defined such that, in a case in which a third switching device fails among the four switching devices, failure of the third switching device does not spread to a failure of a fourth switching device.

2. The power converter according to claim 1,
   wherein the plurality of analysis test electrification patterns are predefined so that the analysis test electrification patterns are different from electrification patterns of the four switching devices used for normal-time control in in which the direct-current power is converted into the multiphase alternating-current power.

3. The power converter according to claim 1, wherein the first and second switching devices are provided on a common electrode side.

4. The power converter according to claim 1, wherein the main circuit is of a 3-level type.

5. A failure analysis method of a power converter that includes a main circuit including four switching devices connected in series in one of legs and configured to convert direct-current power into multiphase alternating-current power through switching of the four switching devices, be able to supply the multiphase alternating-current power to an alternating-current load connected to an output side, and output a detection result of a device short circuit current flowing in each of the four switching devices, the method comprising:
   electrifying the four switching devices for a predetermined time based on one of a plurality of pre-decided analysis test electrification patterns; and
   analyzing soundness of the main circuit using a load current flowing from the main circuit to the alternating-current load, a phase voltage output by the main circuit, and data at the time of electrification for the predetermined time with regard to a device short circuit current flowing in each of the four switching devices,
   wherein analyzing is performed using, of the plurality of analysis test electrification patterns, a first analysis test electrification pattern in which a first switching device is turned on among the four switch devices earlier than analysis using a second analysis test electrification pattern in which the first switching device and a second switching device are turned on among the four switching devices, and
   wherein the plurality of analysis test electrification patterns and an application order thereof are defined such that, in a case in which a third switching device fails among the four switching devices, failure of the third switching device does not spread to a failure of a fourth switching device.

* * * * *